(12) United States Patent
Hsieh et al.

(10) Patent No.: US 6,521,300 B1
(45) Date of Patent: Feb. 18, 2003

(54) METHOD OF A SURFACE TREATMENT IN IMPROVING ADHESION OF AN ORGANIC POLYMERIC LOW-K DIELECTRIC LAYER

(75) Inventors: Tsung-Tang Hsieh, Taipei Hsien (TW); Cheng-Yuan Tsai, Yun-Lin Hsien (TW); Hsin-Chang Wu, Taipei (TW); Chih-An Huang, Taipei Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 15 days.

(21) Appl. No.: 09/682,307

(22) Filed: Aug. 16, 2001

(51) Int. Cl.$^7$ .................................................. H05H 1/24
(52) U.S. Cl. ..................... 427/539; 427/240; 427/577; 427/578; 427/579
(58) Field of Search ................... 427/574, 577, 427/578, 579, 489, 249.15, 255.393, 255.394, 255.6, 539, 240

(56) References Cited

U.S. PATENT DOCUMENTS

| | | | |
|---|---|---|---|
| 6,197,681 B1 | * 3/2001 | Liu et al. | ..................... 438/637 |
| 6,245,690 B1 | * 6/2001 | Yau et al. | ................. 427/255.6 |
| 6,287,990 B1 | * 9/2001 | Cheung et al. | .......... 427/255.6 |
| 6,303,523 B2 | * 10/2001 | Cheung et al. | .......... 427/255.6 |

\* cited by examiner

*Primary Examiner*—Bret Chen
(74) *Attorney, Agent, or Firm*—Winston Hsu

(57) ABSTRACT

A method of coating an organic polymeric low-k dielectric layer starts by depositing a protective layer composed of silicon nitride (SiN) or silicon carbide (SiC) on a substrate. A hydrophilic surface is produced across a top surface of the protective layer by performing a fast surface treatment that subjects the surface to an oxygen-containing plasma at a pre-selected low radio frequency power. An adhesion promoter coating layer is formed over the top surface of the protective layer. The coating layer has promoter molecules, each promoter molecule having at least one hydrophobic group and one hydrophilic group. The low-k dielectric layer is spin-on coated onto the coating layer. Formation of the hydrophilic surface alters an orientation of the adhesion promoter molecules to facilitate the hydrophilic group of each of the adhesion promoter molecules facing the hydrophilic surface while the hydrophobic group of the adhesion promoter molecules faces the low-k dielectric layer.

18 Claims, 2 Drawing Sheets

METHOD OF A SURFACE TREATMENT IN IMPROVING ADHESION OF AN ORGANIC POLYMERIC LOW-K DIELECTRIC LAYER

BACKGROUND OF INVENTION

1. Field of the Invention

The present invention relates to a method of a surface treatment in improving adhesion of an organic polymeric low-k dielectric layer, and more particularly, to a method of enhancing a protective layer/adhesion promoter coating (APC) interface and an adhesion promoter coating/organic polymeric low-k dielectric layer interface.

2. Background of the Invention

With a decreasing size of semiconductor devices and an increase in integrated circuit (IC) density, RC time delay, produced between metal wires, seriously affects IC performance and reduces IC working speed. RC time delay effects are more obvious especially when the line width is reduced to 0.25 μm, or even 0.15 μm, in a semiconductor process. Because, RC time delay produced between metal wires is a product of electrical resistance (R) of the metal wires and parasitic capacitance (C) of the dielectric layer between the metal wires. However, there are two approaches to reduce RC time delay: a) using conductive materials with a lower resistance as a metal wire or, b) reducing the parasitic capacitance of the dielectric layer between metal wires.

In the approach of using a metal wire with a lower resistance, copper interconnection technology replaces the traditional Al:Cu(0.5%) alloy fabrication process and is a necessary tendency in multilevel metallization processes. Due to copper having a low resistance (1.67 μΩ-cm) and higher current density load without electro-migration in the Al/Cu alloy, the parasitic capacitance between metal wires and connection levels of metal wires is reduced.

Additionally, in order to reduce the parasitic capacitance of a dielectric layer between metal wires, it is a trend to adopt low-k dielectric materials. SiLK™ resin, specifically developed by Dow Chemical Company, features a low isotropic dielectric constant of 2.65, 40 percent lower than that of silicon dioxide, the traditional interlayer dielectric material. SiLK™ resin has no fluorine in its composition, which prevents contamination of metal barrier levels. Moreover, SiLK™ resin is stable at temperatures up to 450° C., which provides a wide processing window. As a result, SiLK™ resin is a promising low-k dielectric material in the present day and the integration between SiLK™ resins and copper metal wires is very important. Adhesion between SiLK™ resins and other films, such as cap layers, will particularly influence electrical performance or reliability of metal interconnection technology.

Please refer to FIG. 1. FIG. 1 is a schematic diagram of coating an organic polymeric low-k dielectric layer according to the prior art. As shown in FIG. 1, a semiconductor wafer 10 comprises an underlying conductive region 11, encased in an insulator layer 12. A protective layer 13 is deposited on the underlying conductive region 11 and the insulator layer 12. The protective layer 13, composed of silicon nitride (SiN) or silicon carbide (SiC), is used to prevent conductor atoms in the underlying conducting region 11, such as copper atoms, from migrating into dielectric layers. Additionally, the protective layer 13 also serves as an etch stop layer. An adhesion promoter coating layer 14 is deposited on the surface of the protective layer 13 and a SiLK™ layer 15 is formed on the adhesion promoter coating layer 14. The adhesion promoter coating layer 14 will enhance adhesion between the SiLK™ layer 15 and the underlying layer, formed of a material such as silicon, silicon dioxide, silicon nitride, aluminum, tantalum, tantalum nitride and titanium nitride.

The adhesion promoter coating layer 14 is made of an AP4000 adhesion promoter, produced by Dow Chemical Company. The AP4000 adhesion promoter is a kind of solution, which dissolves adhesion promoter molecules into an organic solvent, 1-methoxy-propanol acetate, to form an adhesion promoter solution with a concentration lower than 3%. In general, a way to form the adhesion promoter coating layer 14 is to flood the wafer surface with the adhesion promoter solution before depositing the SiLK™ layer and then spin it dry. After coating, the adhesion promoter coating layer 14 should be baked and then, the formation of the adhesion promoter coating layer 14 is completed.

SiLK™ resin basically is an aromatic hydrocarbon polymer, which is a hydrophobic material, and an adhesion promoter molecule is composed of at least one hydrophilic group and one hydrophobic group. Ideally, when coating the adhesion promoter coating layer 14 on the protective layer 13, the hydrophilic groups of adhesion promoter molecules will combine with the protective layer 13 while the hydrophobic groups of adhesion promoter (AP) molecules will turn upward. FIG. 2 is the enlarged structural schematic diagram of the adhesion promoter coating layer, the protective layer and the SiLK™ layer. Therein, A represents a hydrophilic group in an AP molecule, B represents a hydrophobic group in an AP molecule, and C represents other elements in an AP molecule. However, the surface of the protective layer 13 is not perfectly hydrophilic, so that orientation of the hydrophilic groups and the hydrophobic groups in the adhesion promoter molecules is irregular, which reduces the effectiveness of the adhesion between the adhesion promoter coating layer 14 and the SiLK™ layer 15. Further, electrical performance or reliability of metal interconnection technology is reduced.

SUMMARY OF INVENTION

It is therefore a primary objective of the present invention to provide a method of a surface treatment that enhances a protective layer/adhesion promoter coating interface and an adhesion promoter coating/organic polymeric low-k dielectric layer interface.

According to the preferred embodiment of the present invention, a protective layer composed of silicon nitride (SiN) or silicon carbide (SiC) is deposited on a substrate. Then, a hydrophilic surface is produced across the top surface by performing a fast surface treatment that subjects a top surface of the protective layer to an oxygen-containing plasma at a pre-selected low radio frequency (RF) power. An adhesion promoter coating is formed over the plasma-treated top surface of the protective layer, and the adhesion promoter coating is comprised of adhesion promoter molecules, each adhesion promoter molecule having at least one hydrophobic group and one hydrophilic group. An organic polymeric low-k dielectric layer is spin-on coated onto the adhesion promoter coating. Wherein, the formation of the hydrophilic surface alters an orientation of the promoter molecules to facilitate the hydrophilic group of each of the promoter molecules in facing the hydrophilic surface while the hydrophobic group of each of the promoter molecules faces the organic polymeric low-k dielectric layer, thereby simultaneously enhancing the protective layer/adhesion promoter coating interface and the adhesion promoter coating/organic polymeric low-k dielectric layer interface.

It is an advantage of the present invention that it provides a method of a surface treatment that enhances the protective layer/adhesion promoter coating interface and the adhesion promoter coating/organic polymeric low-k dielectric layer interface.

These and other objectives and advantages of the present invention will no doubt become obvious to those of ordinary skill in the art after having read the following detailed description of the preferred embodiment that is illustrated in the various figures and drawings.

DETAILED DESCRIPTION

Figure 1:
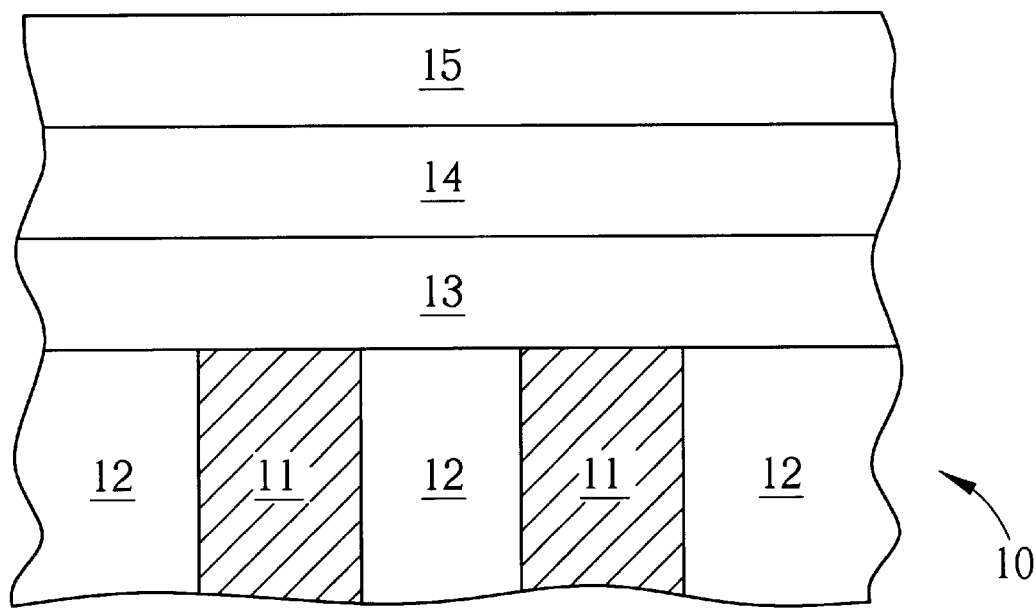
FIG. 1 is a schematic diagram of a prior art method of coating an organic polymeric low-k dielectric layer.
Figure 2:
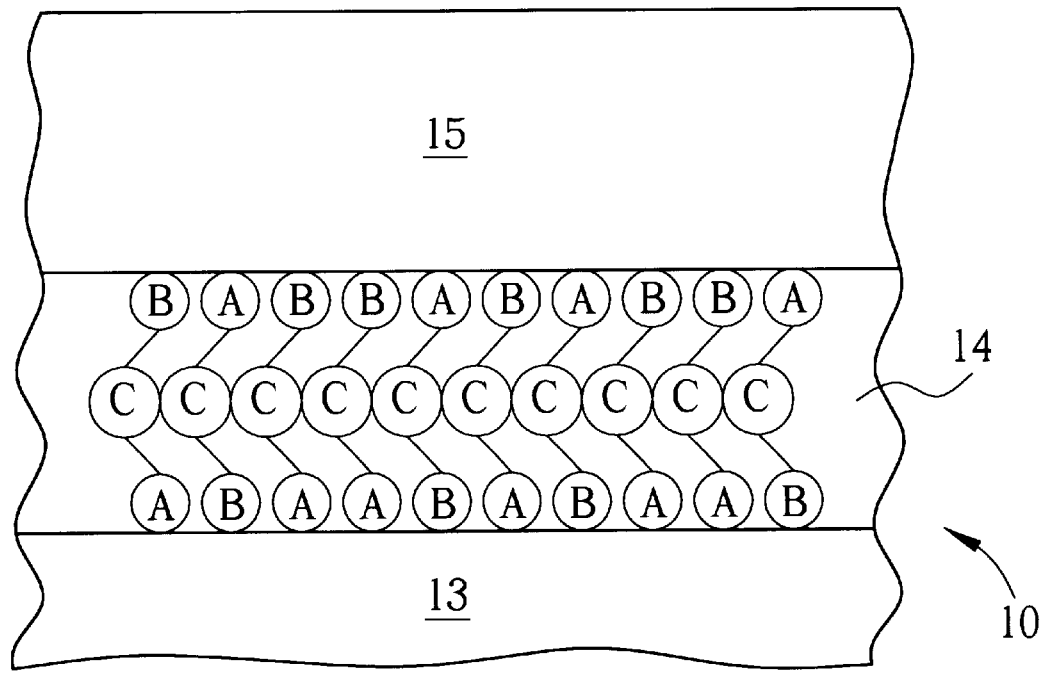
FIG. 2 is an enlarged structural schematic diagram of an adhesion promoter coating, a protective layer and a SiLK™ layer, according to a prior art.
Figure 3:
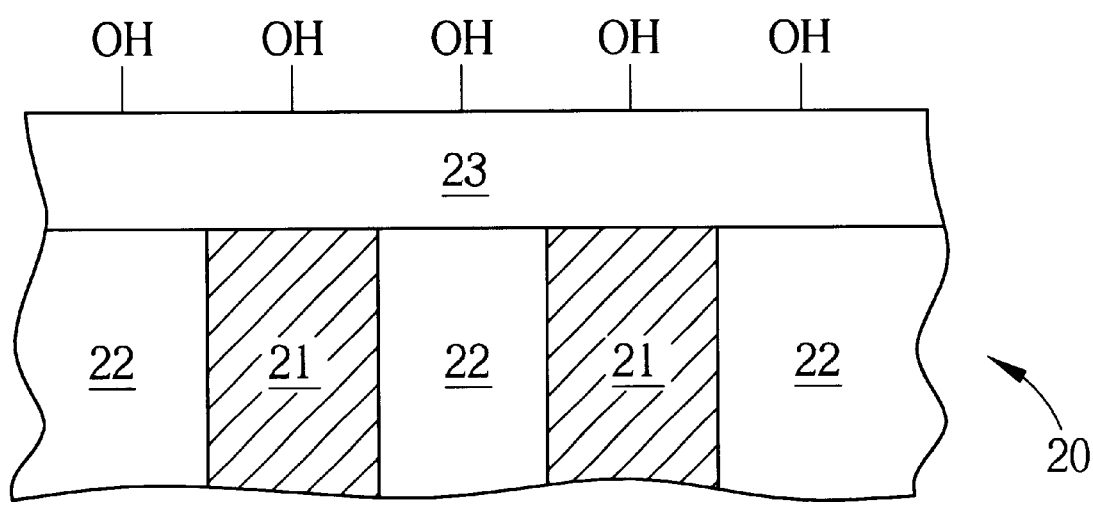
FIG. 3 and FIG. 4 are schematic diagrams of a method of coating an organic polymeric low-k dielectric layer according to the present invention.
Figure 4:
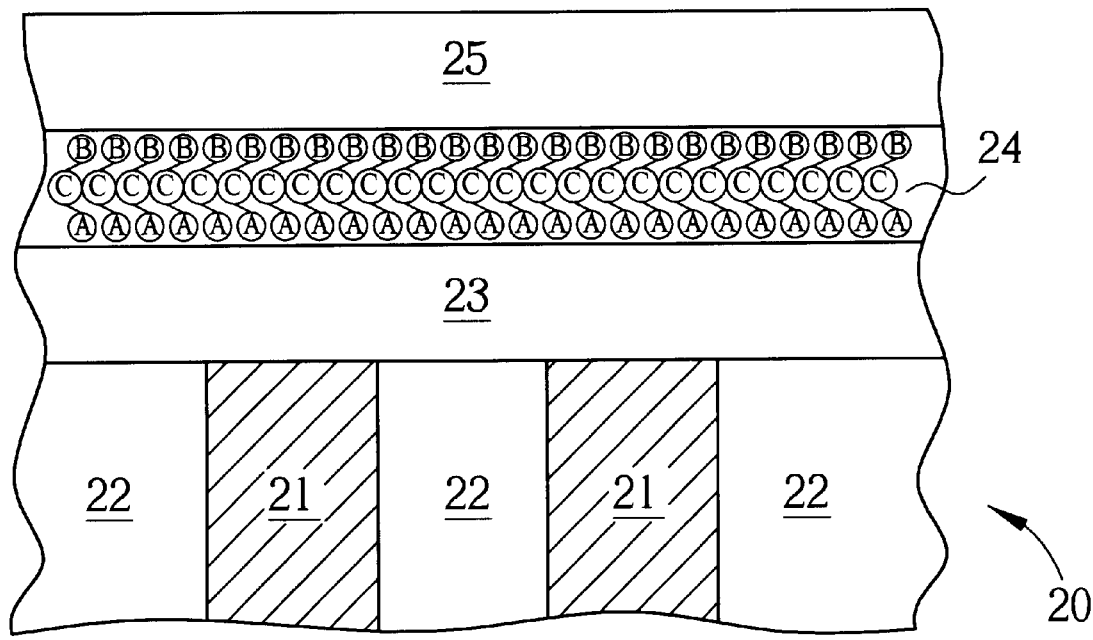

Please refer to FIG. 3 and FIG. 4. FIG. 3 and FIG. 4 are schematic diagrams of a method of coating an organic polymeric low-k dielectric layer according to the prevent invention. As shown in FIG. 3, a semiconductor wafer 20 comprises an underlying conductive region 21, encased in an insulator layer 22. A protective layer 23 is deposited on the underlying conductive layer 21 and the insulator layer 22 by performing a plasma-enhanced chemical vapor deposition (PECVD). As described above, the protective layer 23 is mainly used to prevent conductor atoms in the underlying conducting region 21, such as copper atoms, from migrating into dielectric layers. In the preferred embodiment of the present invention, the protective layer 23 is composed of silicon nitride (SiN), which is produced by introducing silane ($SiH_4$) and ammonia ($NH_3$) as reaction gases into a Novellus Sequal Express PECVD chamber to perform deposition of silicon nitride. A thickness of the deposited silicon nitride is about 350 Å. In another preferred embodiment of the present invention, the protective layer 23 also could be composed of silicon carbide (SiC) produced by plasma-enhanced chemical vapor deposition.

Then, a fast surface treatment is performed on the protective layer 23 in order to produce a hydrophilic surface with OH groups across the top surface that will improve combination between a following deposited adhesion promoter coating layer and the protective layer 23. In the preferred embodiment of the present invention, the fast surface treatment is performed in a Novellus Sequal Express PECVD chamber by utilizing an oxygen-containing plasma at a pre-selected low radio frequency (RF) power, oxygen ($O_2$) or nitrous oxide ($N_2O$) plasma being suggested. The RF power is between 100 and 1000 Watts, optimally about 200 Watts. A flow rate of the nitrous oxide ($N_2O$) gas is between 2000 and 10000 sccm, optimally about 5000 sccm. A temperature of the fast surface treatment is below 420° C. and a treating time is lower than 15 seconds. After treatment of the oxygen-containing plasma, a measurement of a water contact angle is immediately performed on the treated silicon nitride (SiN) surface by utilizing a high-speed contact angle measurement device. The measured water contact angle is about 5~10 degree, which proves that a hydrophilic surface is formed on the protective layer 23 by treatment of the oxygen-containing plasma.

As shown in FIG. 4, an adhesion promoter coating layer 24 is deposited on the protective layer 23. A method to form the adhesion promoter coating layer 14 is to coat the wafer surface with the adhesion promoter solution and then spin it dry. After coating, the adhesion promoter coating layer 14 should be baked to complete the formation of the adhesion promoter coating layer 14. A baking temperature is between 180 and 200° C. and a baking time is about 60 seconds. Finally, a SiLK™ layer 25 is spin-on coated onto the adhesion promoter coating layer 24. Then, coating of an organic polymeric low-k dielectric layer on a semiconductor wafer is completed.

Please refer to FIG. 3 and FIG. 4. As shown in FIG. 3, owing to treatment of the oxygen-containing plasma, a hydrophilic surface with OH groups is produced on the protective layer 23. After coating the adhesion promoter coating layer 24, as shown in FIG. 4, hydrophilic groups of adhesion promoter molecules will combine with the OH groups of the surface of the protective layer 23 while hydrophobic groups of adhesion promoter molecules will turn upward. Therefore, a perfect hydrophobic surface is produced on the adhesion promoter coating layer 24 that provides a good adhesion surface for the SiLK™ layer 25, which favors a hydrophobic surface for contacting. As a result, adhesion between the protective layer 23 and the adhesion promoter coating layer 24 is enhanced. In addition, adhesion between the adhesion promoter coating layer 24 and the SiLK™ layer 25 is enhanced further.

Comparing with the prior art, the present invention utilizes a fast surface treatment on the protective layer 23 before depositing the adhesion promoter coating layer 24 and therefore, a hydrophilic surface is formed on the protective layer 23. The hydrophilic surface alters an orientation of adhesion promoter molecules to facilitate the hydrophilic group of each of the adhesion promoter molecules in facing the hydrophilic surface while the hydrophobic group of each of the adhesion promoter molecules faces the organic polymeric low-k dielectric layer, thereby simultaneously enhancing the protective layer/adhesion promoter coating interface and the adhesion promoter coating/organic polymeric low-k dielectric layer surface. Therefore, enhancement of adhesion between the protective layer 23 and the adhesion promoter coating layer 24 is achieved, while adhesion between the adhesion promoter coating layer 24 and the SiLK™ layer 25 is improved further.

The above disclosure is based on the preferred embodiment of the present invention. Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of a surface treatment in improving adhesion of an organic polymeric low-k dielectric layer having a dielectric constant of approximately between 2.5 and 3.5, the method comprising:

depositing a protective layer over a substrate, the protective layer being made of a material selected from the group consisting of silicon nitride, silicon carbide (SiC), and SiC-based ceramics;

performing a surface treatment by subjecting a top surface of the protective layer to an oxygen-containing plasma at a pre-selected radio frequency (RF) power to produce a hydrophilic surface across the top surface;

forming an adhesion promoter coating (APC) over the plasma-treated top surface of the protective layer, the APC being comprised of promoter molecules, each promoter molecule having at least one hydrophobic group and one hydrophilic group;

spin-on coating an organic polymeric low-k layer onto the APC;

wherein the formation of the hydrophilic surface alters an orientation of the promoter molecules to facilitate the hydrophilic group of each of the promoter molecules to face the hydrophilic surface while the hydrophobic group of each of the promoter molecules faces the organic polymeric low-k layer, thereby simultaneously enhancing the protective layer/APC interface and the APC/organic polymeric low-k layer interface.

2. The method of claim 1, wherein the protective layer is formed by a plasma-enhanced chemical vapor deposition (PECVD) method.

3. The method of claim 1, wherein the oxygen-containing plasma is a nitrous oxide ($N_2O$) plasma.

4. The method of claim 3, wherein a flow rate of $N_2O$ ranges from 2000 sccm (standard cubic centimeter per minute) to 10000 sccm.

5. The method of claim 1, wherein the RF power ranges from 100 Watts to 1000 Watts.

6. The method of claim 1, wherein the RF power is about 200 Watts.

7. The method of claim 1, wherein the surface treatment duration is less than 15 seconds.

8. The method of claim 1, wherein the surface treatment temperature is lower than 420° C.

9. The method of claim 1, wherein the hydrophobic group comprises an unsaturated hydrocarbon segment, and the hydrophilic group comprises a silicon-containing moiety.

10. The method of claim 1, wherein the organic polymeric low-k layer is a hydrocarbon polymer of a three-dimensional network that is made from acetylene-containing polyphenylene precursor.

11. A surface treatment process, particularly used for semiconductor processes, the surface treatment process comprising:

depositing an inorganic Si-containing non-oxide layer over a substrate by way of a chemical vapor deposition (CVD) method;

performing a surface treatment to a top surface of the Si-containing non-oxide layer by subjecting the top surface to an oxygen-containing plasma to form a hydrophilic surface across the top surface;

forming an adhesion promoter coating (APC) over the hydrophilic surface; and spin-on coating an organic polymeric low-k layer having a dielectric constant of approximately between 2.5 and 3.5 onto the APC.

12. The surface treatment process of claim 11, wherein the Si-containing non-oxide layer is made of a material selected from the group consisting of silicon nitride, silicon carbide (SiC), and SiC-based ceramics.

13. The surface treatment process of claim 11, wherein the Si-containing non-oxide layer is formed by a plasma-enhanced chemical vapor deposition (PECVD) method.

14. The surface treatment process of claim 11, wherein the oxygen-containing plasma is a nitrous oxide ($N_2O$) plasma.

15. The surface treatment process of claim 11, wherein a flow rate of $N_2O$ is about 5000 sccm.

16. The surface treatment process of claim 11, wherein the surface treatment duration is less than 15 seconds.

17. The surface treatment process of claim 11, wherein the APC is comprised of promoter molecules, each promoter molecule having at least one hydrophobic group that comprises an unsaturated hydrocarbon segment and one hydrophilic group that comprises a silicon-containing moiety.

18. The surface treatment process of claim 11, wherein the organic polymeric low-k layer is a hydrocarbon polymer of a three-dimensional network that is made from acetylene-containing polyphenylene precursor.

\* \* \* \* \*